(12) United States Patent
Yokoyama et al.

(10) Patent No.: US 6,731,563 B1
(45) Date of Patent: May 4, 2004

(54) DATA BACKUP DEVICE AND STEP-UP/STEP-DOWN POWER SUPPLY

(75) Inventors: Chikara Yokoyama, Hyogo (JP); Yuji Funaba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/031,118
(22) PCT Filed: Jun. 8, 2000
(86) PCT No.: PCT/JP00/03732
§ 371 (c)(1),
(2), (4) Date: Jan. 16, 2002
(87) PCT Pub. No.: WO01/95335
PCT Pub. Date: Dec. 13, 2001

(51) Int. Cl.$^7$ .............................. G11C 7/00; G11C 8/00
(52) U.S. Cl. ................. 365/228; 365/222; 365/189.09; 365/196; 365/230.03
(58) Field of Search .................. 365/222, 228, 365/230.03, 189.09, 196

(56) References Cited

U.S. PATENT DOCUMENTS

| 4,313,180 A | * | 1/1982 | Mochizuki et al. ......... 365/222 |
| 4,316,248 A | * | 2/1982 | Retter .......................... 714/22 |
| 4,979,171 A | * | 12/1990 | Ashley ........................ 370/525 |
| 5,430,681 A | * | 7/1995 | Sugawara et al. .......... 365/222 |
| 5,465,236 A | * | 11/1995 | Naruke .................. 365/185.11 |
| 5,590,082 A | * | 12/1996 | Abe ............................. 365/222 |
| 5,640,357 A | * | 6/1997 | Kakimi ....................... 365/229 |
| 5,659,208 A | * | 8/1997 | Kimble et al. ................ 307/82 |
| 6,018,802 A | * | 1/2000 | Abe et al. ................... 713/300 |
| 6,084,813 A | * | 7/2000 | Kikuchi et al. ............. 365/222 |
| 6,088,762 A | * | 7/2000 | Creta ......................... 711/106 |

FOREIGN PATENT DOCUMENTS

| JP | 62-75072 | 4/1987 |
| JP | 4-295238 | 10/1992 |
| JP | 5-91734 | 4/1993 |
| JP | 7-67326 | 3/1995 |

OTHER PUBLICATIONS

Highly Reliable Computer Memory Circuit With Battery Backup. IBM Technical Disclosure Bulletin, Apr. 1991, US. vol. No.: 33. Issue No.: 11. p. No:. 323–327.*

* cited by examiner

Primary Examiner—David Nelms
Assistant Examiner—Ly Duy Pham
(74) Attorney, Agent, or Firm—Sughrue Mion, PLLC

(57) ABSTRACT

When a power supply detection unit 5 detects an OFF command of a battery 2, a DRAM 1 is changed to a self-refresh mode. Then, power is fed from a backup power supply 4 to the DRAM 1.

12 Claims, 3 Drawing Sheets

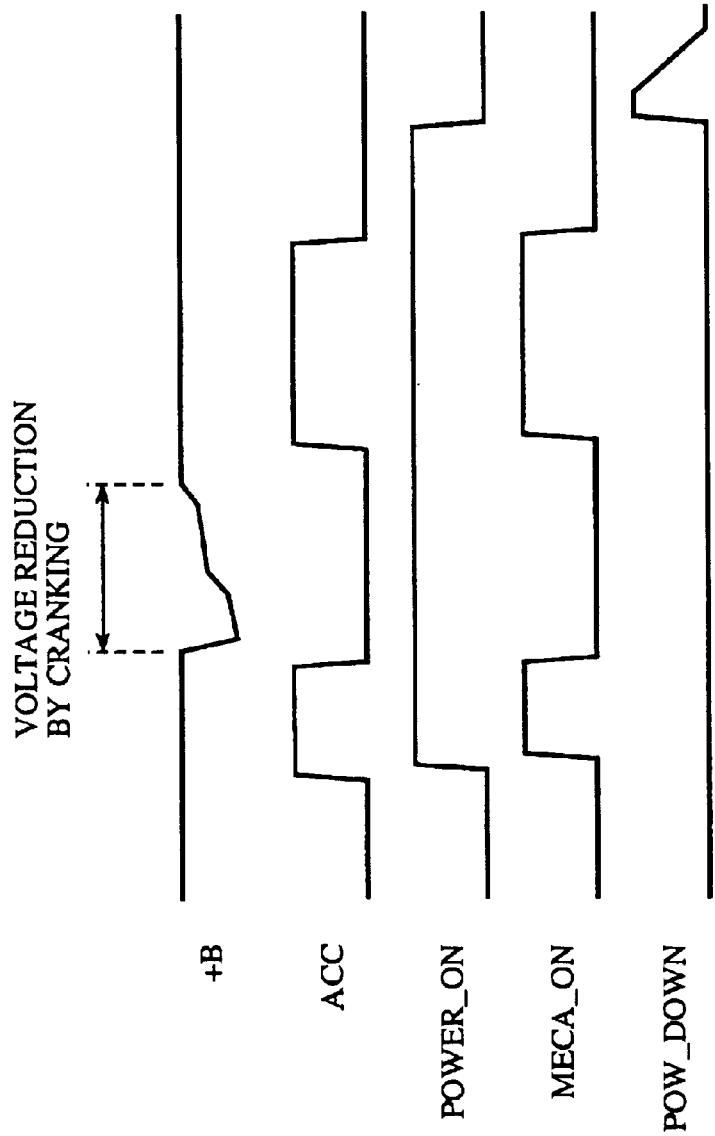

DATA BACKUP DEVICE AND STEP-UP/ STEP-DOWN POWER SUPPLY

TECHNICAL FIELD

This invention relates to a data backup apparatus for backing up data by controlling power fed to a memory, and a step-up/down power supply for feeding power to on-vehicle equipments, e.g., a car navigation device, and so on.

BACKGROUND ART

In a conventional data backup apparatus, an SRAM, a rewritable ROM or the like is installed therein, and data in an on-vehicle equipment such as a car navigation device is saved in the SRAM or the like.

However, in the case of using an SRAM, the limited amount of storable information per area makes it difficult to save a large amount of data.

In addition, in the case of using a rewritable ROM, a considerable time is required for information rewriting, and due to its inherent characteristics, a limit is placed on the number of rewritable times. Thus, in general, data saving by use of a ROM has been limited to a program code and so on, which requires no rewriting operation, and work information has not been saved at all.

Therefore, it was required to save only minimum necessary information in the SRAM and read other data from an external memory or the like at the time of starting the on-vehicle equipment, thereby to restructure the data in a main memory.

Since the conventional data backup apparatus is constructed as mentioned above, it requires a large amount of data, such as map information on the surroundings, to be read from an external memory or the like, at the time of starting the on-vehicle equipment. Thus, there has been such an inevitable problem in the conventional art that a considerable time is required before the on-vehicle equipment starts its actual operation.

The installation of a large-capacity SRAM eliminates the necessity of reading a large amount of data from an external memory at the time of starting the on-vehicle equipment. However, because of the limited amount of storable information per area and the high price of an SRAM, it is not practical to install a large-capacity SRAM in an on-vehicle equipment.

The present invention has been made to solve the foregoing problems, and it is an object of the invention to provide a data backup apparatus capable of saving a large amount of data inside an on-vehicle equipment.

It is another object of the invention to provide a step-up/ down power supply capable of stably operating an on-vehicle equipment by applying a predetermined voltage to the on-vehicle equipment even when fluctuation occurs in a voltage applied from a main power supply such as an on-vehicle battery.

DISCLOSURE OF THE INVENTION

In accordance with the present invention, there is provided a data backup apparatus, comprising: control means for changing a dynamic RAM to a self-refresh mode when detection means detects an OFF command of a main power supply, and feeding power from a backup power supply to the dynamic RAM.

Thus, it is possible to save a large amount of data inside an on-vehicle equipment.

According to the data backup apparatus of the invention, power is fed from the main power supply to the dynamic RAM during the period from the detection of the OFF command of the main power supply to the completion of the changing to the self-refresh mode.

Thus, it is possible to surely save the data of the on-vehicle equipment.

According to the data backup apparatus of the invention, among a plurality of memory areas constituting the dynamic RAM, a memory area that receives power from the backup power supply is designated, and power is fed only to the thus designated memory area.

Thus, it is possible to reduce power consumption during the backing-up operation.

According to the data backup apparatus of the invention, information regarding the memory area to receive power from the backup power supply is indicated.

Thus, it is possible to verify the normal ending of previous processing, and normal backing-up during the stopped period. It is also possible to verify an unexpected memory loss or the like caused by a reduction in a backup power supply or the like during the backing-up operation.

According to the data backup apparatus of the invention, the feeding of power from the main power supply to a predetermined equipment is stopped, when the output voltage of the main power supply is reduced.

Thus, it is possible to suppress a reduction in the output voltage of the main power supply.

According to the data backup apparatus of the invention, if an SDRAM is used as the dynamic RAM, the control means and the SDRAM are kept separated from each other until the initial setting of the control means is completed.

Thus, it is possible to prevent the destruction or the like of data saved in the SDRAM.

In accordance with the invention, there is provided a step-up/down power supply, comprising: a step-up DC/DC converter for outputting a predetermined voltage by stepping up a voltage applied from a main power supply when the applied voltage drops below a reference voltage.

Thus, since the predetermined voltage can be applied to an on-vehicle equipment even if a cranking operation or the like causes a reduction in the voltage applied from the main power supply, it is possible to stably operate the on-vehicle equipment.

According to the step-up/down power supply of the invention, a voltage signal is captured from an outputting stage for outputting a predetermined voltage, so as to activate a switching element of the step-up DC/DC converter.

Thus, even if the voltage applied from the main power supply drops below the operating voltage of the switching device, it is possible to continue the operation of the step-up DC/DC converter.

BRIEF DESCRIPTION OF THE DRAWINGS

FIG. 3 is an explanatory view illustrating a power supply detection sequence.

BEST MODES FOR CARRYING-OUT THE INVENTION

Next, the preferred embodiments of the present invention will be described in detail with reference to the accompanying drawings.

First Embodiment

Figure 1:
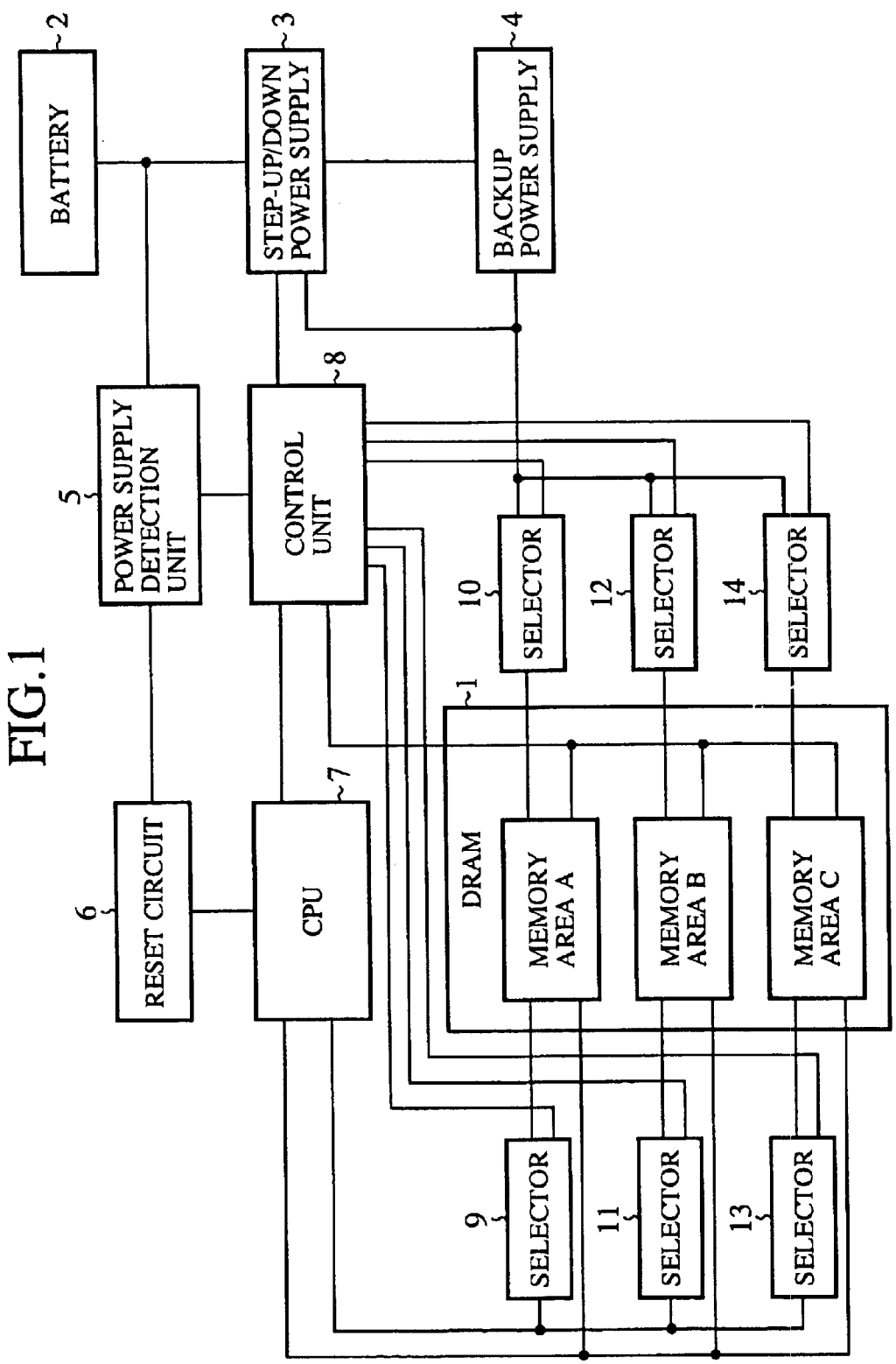
FIG. 1 is a schematic diagram showing a data backup apparatus according to a first embodiment of the present invention.

FIG. 1 is a schematic diagram showing a data backup apparatus according to a first embodiment of the invention. In the drawing, a reference numeral 1 denotes a dynamic RAM (DRAM) for storing the data of an on-vehicle equipment such as a car navigation device, and the DRAM includes a plurality of memory areas A to C.

A reference numeral 2 denotes a battery (main power supply) installed in a vehicle; 3 a step-up/down power supply that receives a voltage applied from the battery 2 and outputs a predetermined voltage even if fluctuation occurs in the applied voltage; and 4 a backup power supply.

A reference numeral 5 denotes a power supply detection unit (detection means) for detecting an ON/OFF command or the like of the battery 2; 6 a reset circuit for initializing a CPU 7 when the power supply detection unit 5 detects the ON command; 7 a CPU for changing the DRAM to a self-refresh mode when the power supply detection unit 5 detects the OFF command; 8 a control unit for switching the power supply source of the DRAM 1 from the step-up/down power supply 3 to the backup power supply 4 when the DRAM 1 is shifted to the self-refresh mode; and numerals 9 to 14 denote selectors. The CPU 7, the control unit 8 and the selectors 9 to 14 constitute a control means.

Next, an operation will be described as below.

When the switch of a vehicle key is in an ACC or ON position, power is fed from the battery 2 to the step-up/down power supply 3. From the step-up/down power supply 3, power is fed to the CPU 7 and the DRAM 1. The specific operation of the step-up/down power supply 3 will be described later.

Accordingly, the CPU7 can perform various data processing operations (if it is a CPU for a navigation device, the CPU 7 can execute route searching, map displaying and so on), and stores data regarding such processing in the DRAM 1.

Then, when the switch of the vehicle key is changed to an OFF position, the power supply detection unit 5 detects a power supply OFF command, and notifies the detection to the CPU 7.

Upon receiving the OFF command from the power supply detection unit 5, the CPU 7 sets the DRAM 1 into the self-refresh mode to prevent the loss of data stored in the DRAM 1.

Specifically, since the same data must be written at regular intervals to continuously hold the data in the DRAM 1, the DRAM 1 is changed to the mode of repeating automatic data writing (self-refresh mode). If the DRAM 1 is an SDRAM, when a CKE terminal is at "H", control from an external unit is accepted. On the other hand, when the CKE terminal is at "L", the previous mode is maintained Thus, the DRAM 1 is changed to the self-refresh mode before the CKE terminal is changed from "H" to "L".

After the shifting of the DRAM 1 to the self-refresh mode, the control unit 8 switches the power supply source of the DRAM 1 from the step-up/down power supply 3 to the backup power supply 4.

Thus, since the DRAM 1 receives power fed from the backup power supply 4 even if the output voltage of the battery 2 drops, data can be held continuously.

Subsequently, when the switch of the vehicle key is returned to the ACC or ON position, the power supply detection unit 5 detects a power supply ON command, and notifies the detection to the reset circuit 6.

Upon receiving the ON command from the power supply detection unit 5, the reset circuit 6 initializes the CPU 7, and the CPU 7 releases the self-refresh mode.

The control unit 8 disconnects the CPU 7 and the DRAM from each other during the initialization of the CPU 7 to prevent the destruction or the like of the data stored in the DRAM 1. After the completion of the initialization of the CPU 7, the control unit 8 connects the CPU 7 and the DRAM 1 with each other, and switches the power supply source of the DRAM 1 from the backup power supply 4 to the step-up/down power supply 3.

As apparent from the foregoing, according to the first embodiment, when the power supply detection unit 5 detects the OFF command of the battery 2, the DRAM 1 is set to the self-refresh mode, and power is fed from the backup power supply 4 to the DRAM 1. Thus, a large amount of data can be saved in the DRAM 1 low in price and large in capacity. Therefore, for example, if an on-vehicle equipment is a navigation device, not only the present position information but surrounding map information and additional information can also be backed up, so that the device can be set to a usable state almost instantaneously when it is actuated at the next time.

Second Embodiment

Figure 2:
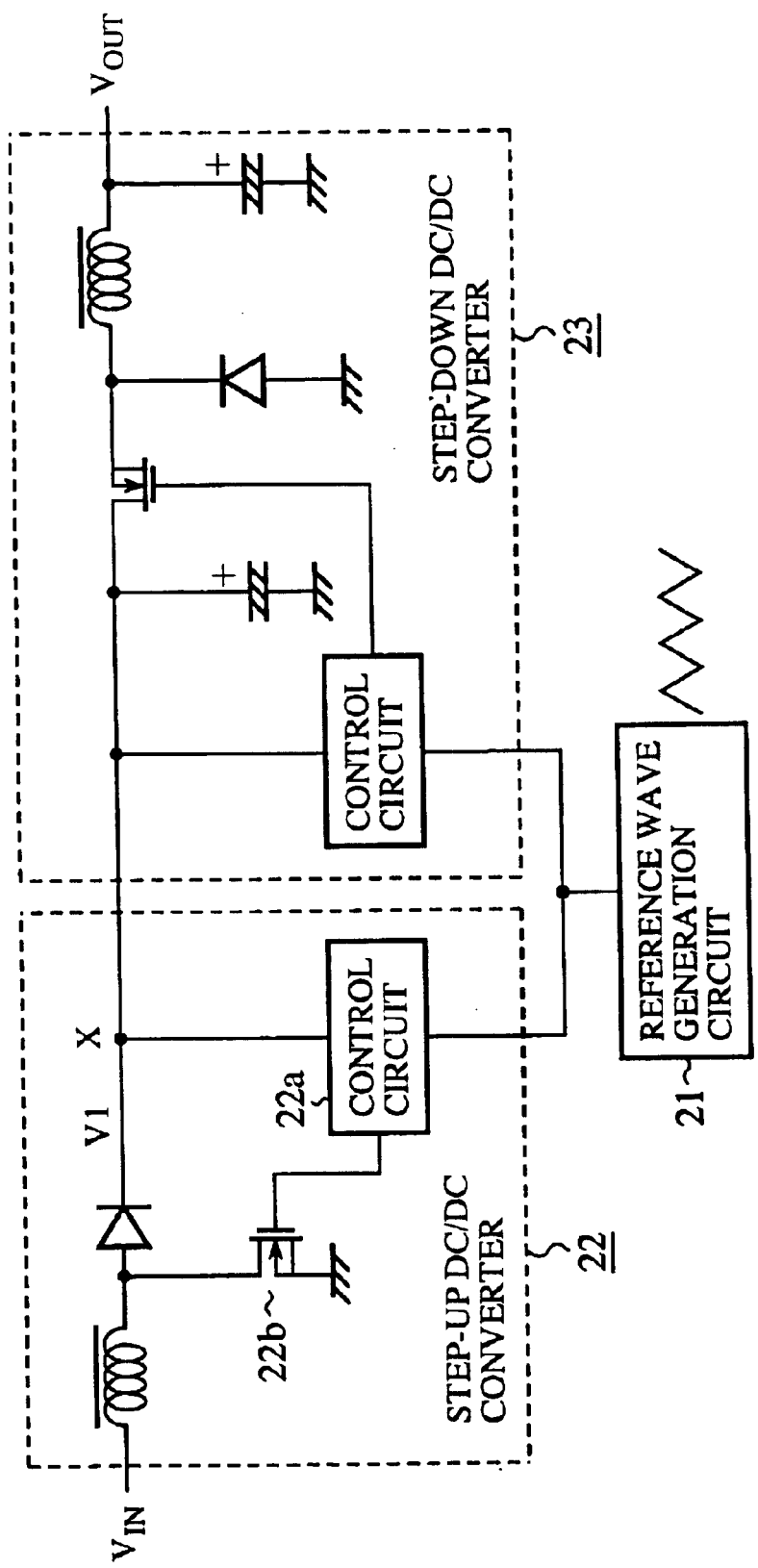
FIG. 2 is a schematic diagram showing a step-up/down power supply according to a second embodiment of the invention.

FIG. 2 is a schematic diagram showing a step-up/down power supply according to a second embodiment of the invention. In the drawing, a reference 21 denotes a reference wave generation circuit; 22 a step-up DC/DC converter for applying a predetermined voltage V1 by stepping up a voltage $V_{IN}$ applied from the battery 2 when the applied voltage $V_{IN}$ drops below a reference voltage; and 23 a step-down DC/DC converter connected in series to the step-up DC/DC converter 22, and adapted to apply a predetermined voltage $V_{OUT}$ by stepping down a voltage $V_{IN}$ applied from the battery 2 when the applied voltage $V_{IN}$ rises above the reference voltage.

Next, an operation will be described.

In the foregoing first embodiment, when the switch of the vehicle key was in the ACC or ON position, the power was fed from the battery 2 through the step-up/down power supply 3 to the CPU 7 and the DRAM 1. The reason for feeding power through the step-up/down power supply is described below.

For starting an engine, cranking is carried out by actuating a self-starting motor. However, since the cranking operation causes a reduction in the output voltage of the battery 2 (see "+B" in FIG. 3), an operable voltage for the CPU 7 or the DRAM 1 cannot be secured. Thus, the data stored in the DRAM 1 may be lost, and other problems may occur.

The step-up/down power supply 3 is provided to secure operable voltages for the CPU 7 and the DRAM 1 even if the output voltage of the battery 2 is reduced by the cranking operation.

As shown in FIG. 2, the step-up/down power supply 3 includes: a step-up DC/DC converter 22 for applying a predetermined voltage V1 by stepping up a voltage $V_{IN}$ applied from the battery 2 when the voltage $V_{IN}$ drops below the reference voltage; and a step-down DC/DC converter 23 for applying a predetermined voltage $V_{OUT}$ by stepping down a voltage $V_{IN}$ applied from the battery 2 when the voltage $V_{IN}$ raises above the reference voltage.

The step-up DC/DC converter 22 is designed to hardly operate in the operating voltage region of the step-down DC/DC converter 23; and the step-down DC/DC converter 23 to hardly operate in the operating voltage region of the step-up DC/DC converter 22. Accordingly, by individually operating the converters, conversion efficiency can be increased.

In addition, as shown in FIG. 2, the control circuit 22a of the step-up DC/DC converter 22 captures a voltage signal from an output stage X that outputs a predetermined voltage V1, and activates a MOS-FET 22b as a switching device. Accordingly, even if the voltage $V_{IN}$ applied from the battery 2 drops below the operable voltage of MOS-FET 22b, a proper operable voltage can be secured for the MOS-FET 22b. As a result, it is possible to continue a stepping-up operation.

As a step-up/down power supply for outputting a predetermined voltage irrespective of fluctuation in the applied voltage, there has conventionally been available a fly-back type converter using a transformer. However, in the case of the flay-back type converter, convertible power is decided depending on the capacity of the transformer. In the case of the device of a limited area, such as an on-vehicle equipment, the size of the transformer was a bottleneck, making it difficult to construct a large-capacity step-up/down power supply. In the step-up/down power supply 3 shown in FIG. 2, since a choke coil is used instead of the transformer, a mounting area can be designed to be small with respect to a power supply capacity.

As apparent from the foregoing, according to the second embodiment, since the step-up DC/DC converter 22 is provided for applying a predetermined voltage V1 by stepping up a voltage $V_{IN}$ applied from the battery 2 when the voltage $V_{IN}$ drops below the reference voltage, a predetermined voltage can be applied to the on-vehicle equipment even if a cranking operation or the like causes a reduction in the output voltage of the battery 2, making it possible to stably operate the on-vehicle equipment. Therefore, since the resetting of the navigation device or the like can be prevented at the time of starting the engine, it is also possible to apply the step-up/down power supply to a car in an idling stop state.

Third Embodiment

In the foregoing first embodiment, when the DRAM 1 is shifted to the self-refresh mode, the power supply source of the DRAM 1 is switched from the step-up/down power supply 3 to the backup power supply 4. However, it can also be arranged such that the CPU 7 designates one memory area among a plurality of memory areas A to C, which receives power from the backup power supply 4 (e.g., in the case where there is data stored in the memory area A while no data have been stored in the memory areas B and C, only the memory area A is set to receive power by controlling the selectors 9 and 10), and the control unit 8 provides power only to the thus designated memory area.

Thus, it is possible to reduce the consumption of power during the period in which a backing-up operation is being performed.

Fourth Embodiment

The foregoing third embodiment has been explained as to the case where a memory area that can receive power from the backup power supply 4 is designated, and only the thus designated memory area can be provided with power. However, a backup verification mechanism for indicating information regarding the memory area designated to receive power from the backup power supply 4 may be provided on the memory map of the CPU 7.

Thus, it is possible to verify the normal ending of previous processing, the execution of normal backing-up during the stopped period, and an unexpected memory loss or the like caused by a reduction or the like in the backup power supply 4 during the backing-up operation.

Firth Embodiment

The foregoing first embodiment has been explained as to the case in which the step-up/down power supply 3 was provided for securing the operable voltage of the CPU 7 or the DRAM 1 even if a reduction in the output voltage of the battery 2 is caused due to the cranking operation. However, it can be arranged such that when a reduction occurs in the output voltage of the battery 2, the feeding of power from the battery 2 to a certain equipment is stopped.

Thus, in a case where the output voltage of the battery 2 drops because of the cranking operation or the like, power supply for equipments such as a CD-ROM, DVD, and a display LCD, which are other than main body function, can be reduced, so that it is possible to suppress a reduction in the output voltage of the battery 2.

Industrial Applicability

As can be understood from the foregoing, the data backup apparatus of the invention is suitable for backing up a large amount of data by properly feeding power to the large-capacity dynamic RAM installed in the on-vehicle equipment.

In addition, the step-up/down power supply of the invention is suitable for stably operating an on-vehicle equipment by applying a predetermined voltage to the on-vehicle equipment even when fluctuation occurs in a voltage applied from the main power supply such as a battery.

What is claimed:

1. A data backup apparatus comprising:

a dynamic RAM for storing data;

detection means for detecting an OFF command of a main power supply; and control means for changing said dynamic RAM to a self-refresh mode when said detection means detects the OFF command of the main power supply, and feeding power from a backup power supply to said dynamic RAM, wherein said control means designates one memory area that receives power from the backup power supply among a plurality of memory areas comprising said dynamic RAM, and feeds power only to the designated memory area.

2. The data backup apparatus according to claim 1, wherein said control means supplies the dynamic RAM with power from the main power supply during the period from the detection of the OFF command of the main power supply to completion of the changing to the self-refresh mode.

3. The data backup apparatus according to claim 1, wherein said control means indicates information regarding the memory area that receives power from the backup power supply.

4. The data backup apparatus according to claim 1, wherein said control means stops feeding of power from the main power supply to a predetermined equipment, when an output voltage of the main power supply is reduced.

5. The data backup apparatus according to claim 1, wherein if an SDRAM is used as the dynamic RAM, said control means and said SDRAM are kept separated from each other until initial setting of said control means is completed.

6. A data backup apparatus comprising:

a dynamic RAM for storing data;

a power supply detection circuit for detecting an OFF command of a main power supply; and a control circuit for changing said dynamic RAM to a self-refresh mode when said power supply detection circuit detects the OFF command of the main power supply, and feeding power from a backup power supply to said dynamic RAM, wherein said control circuit designates one memory area that receives power from the backup power supply among a plurality of memory areas comprising said dynamic RAM, and feeds power only to the designated memory area.

7. The data backup apparatus according to claim 6, wherein said control means supplies the dynamic RAM with power from the main power supply during the period from the detection of the OFF command of the main power supply to completion of the changing to the self-refresh mode.

8. The data backup apparatus according to claim 6, wherein said control means indicates information regarding the memory area that receives power from the backup power supply.

9. The data backup apparatus according to claim 6, wherein said control means stops feeding of power from the main power supply to a predetermined equipment, when an output voltage of the main power supply is reduced.

10. The data backup apparatus according to claim 6, wherein if an SDRAM is used as the dynamic RAM, said control means and said SDRAM are kept separated from each other until initial setting of said control means is completed.

11. The data backup apparatus according to claim 6, wherein said control circuit further comprises a CPU and a plurality of selector circuits that control the backup power supplied to the designated memory area.

12. The data backup apparatus according to claim 11, further comprising a reset circuit that initializes the CPU when the power supply detection circuit detects an ON command from the main power supply.

* * * * *